(12) United States Patent
Karube et al.

(10) Patent No.: US 6,617,551 B2
(45) Date of Patent: Sep. 9, 2003

(54) HEATER

(75) Inventors: Ikue Karube, Yokosuka (JP); Shiro Ezaki, Yokohama (JP); Takaaki Karube, Yokosuka (JP)

(73) Assignee: Harison Toshiba Lighting Corporation, Ehime (JP)

(*) Notice: Subject to any disclaimer, the term of this patent is extended or adjusted under 35 U.S.C. 154(b) by 0 days.

(21) Appl. No.: 10/132,729

(22) Filed: Apr. 26, 2002

(65) Prior Publication Data

US 2002/0175154 A1 Nov. 28, 2002

(30) Foreign Application Priority Data

Apr. 27, 2001 (JP) .......... 2001-132082
Mar. 27, 2002 (JP) .......... 2002-088913

(51) Int. Cl.$^7$ .......... G03G 15/20; H05B 3/12
(52) U.S. Cl. .......... 219/216; 399/333; 219/553
(58) Field of Search .......... 219/216, 469, 219/552, 553; 399/329–334

(56) References Cited

U.S. PATENT DOCUMENTS

| | | | | |
|---|---|---|---|---|
| 4,395,109 A | * | 7/1983 | Nakajima et al. | 219/216 |
| 5,468,936 A | * | 11/1995 | Deevi et al. | 219/553 |
| 6,006,051 A | * | 12/1999 | Tomita et al. | 219/216 |
| 6,084,221 A | * | 7/2000 | Natsuhara et al. | 219/553 |
| 6,118,109 A | * | 9/2000 | Sako | 219/216 |

FOREIGN PATENT DOCUMENTS

JP  2001242726  * 9/2001

* cited by examiner

Primary Examiner—Joseph Pelham
(74) Attorney, Agent, or Firm—Banner & Witcoff, Ltd.

(57) ABSTRACT

A heater having a substrate composed of a heat-resistant and electrically insulating material, a heater element formed on the surface of the substrate in a belt-shape in the longitudinal direction containing an alloy of Ag and Pd having a weight ratio Ag/Pd of 90/10 to 70/30, glass, and an inorganic oxide and/or an inorganic nitride of 0.1 to 20 wt % to the weight of the alloy of Ag and Pd, and a power supply terminal part formed in connection with the heater element. The heater is suited to use for a fixing device of an image forming apparatus.

20 Claims, 6 Drawing Sheets

HEATER

CROSS-REFERENCE TO RELATED APPLICATIONS

This application is based upon and claimed the benefit of priority of Japanese Patent Application Nos. 2001-132082 and 2002-088913 filed on Apr. 27, 2001 and Mar. 27, 2002, respectively, the contents of which are incorporated herein by reference.

BACKGROUND OF THE INVENTION (1) Field of the Invention

The present invention relates to a heater used as a heating source in office automation devices, household electric appliances, and precision machine, and more particularly to a fixing device for fixing a toner image in an office automation device such as a copying machine or a facsimile mounting the heater and an image forming apparatus using the fixing device.

(2) Description of the Description of the Related Art

To realize compact circuit boards, miniaturizing constituent components with multi-function have been promoted.

In an electronic copying machine, a toner image formed on a photosensitive drum is transferred onto a copy paper or copy film. The copy paper held between a heater and a pressure roller passes therethrough and is heated by the heater, thus the toner is fused and fixed on the paper.

This kind of heater is disclosed in U.S. Pat. Nos. 5,068, 517, 5,162,635, and 5,587,097. These heaters are elongated thick heater elements formed on one surface of a heat-resistant and electrically insulating substrate composed of a ceramic material such as $Al_2O_3$ (aluminum oxide), AlN (aluminum nitride), or SiC (silicon carbide). The heater element contains Ag and Pd (silver and palladium) alloy and formed by conventional print-coating techniques.

A heater having the heater element with power supply terminals is known. The terminal composed of Ag (silver) or Pt (platinum) is coated on each one end of the heater element. The surface of the heater element is further covered with an insulating glassy overcoat layer or protective layer, thus the heater element is protected from wear and shock, increased in the mechanical strength, and protected from oxidation, sulfuration, and electric shock.

A heater, which provides a temperature detection element such as a thermistor, is also known. The temperature detection element, which is attached on the other surface of the substrate, detects temperature of the heater element and feeds back detection signals to a temperature control circuit device so that electric power to be applied to the heater is controlled and the temperature is kept constant.

A fixing device with such a heater has a good heat-up (temperature rise) characteristic and can heat toner almost directly, so that the thermal efficiency is high, and electric power consumption is saved, and further there is an advantage that the fixing device can be made compact.

As a material for forming the heater element of the heater, the aforementioned Ag—Pd alloy is superior from the various viewpoints, and therefore it is widely used. In recent years, however, it is strongly desired to lower the amount of palladium in the alloy because palladium is apt to increase in cost of the heater.

A heater element for a heater disclosed in Japanese Patent publication No.H7-201459 is composed of an alloy of Ag (silver) and Pd (palladium) as its main component and the content of Pd (palladium) is relatively low (0.3 to 40 wt %). The patent publication also discloses that an active metal and a glass component of 10 wt % or less of the Ag—Pd alloy are further contained in the heater element.

According to the description of the aforementioned patent publication, the heater element is formed on the substrate with high adhesive strength since the amount of palladium is reduced, and its heating and cooling speeds are fast and its temperature control can be made with high precision. However, when an active metal such as Ti or Zr is added, there is the possibility that it reacts with glass and may crystallize the heater element, which results in forming porous therein.

The heater requires the glass component as a binder for forming the heater element. However, the glass is apt to be degraded with time and by the heat cycle or due to the exposure of a high temperature. Therefore resistance of the heater element is apt to be varied with time.

In recent years, nitriding ceramics such as AlN (aluminum nitride, thermal conductivity 100 to 180 W/mk) or $Si_3N_4$ (silicon nitride) have been often used as substrates rather than substrates of $Al_2O_3$ (aluminum oxide, thermal conductivity about 20 W/mk) due to their superior thermal conductivities.

Substrate of nitriding ceramics, for example, AlN (aluminum nitride) contains nitrogen. When thick film patterns of a heater element, a power supply terminal, a wiring conductor and an overcoat layer are printed with paste on the AlN (aluminum nitride) substrate and is fired at about 850° C., the AlN (aluminum nitride) substrate is reacted with the paste, and $N_2$ gas (nitrogen) is generated from the substrate and bubbles of the $N_2$ gas (nitrogen) is penetrated into the interface between the AlN (aluminum nitride) substrate and the patterns. Adhesion between the substrate and the patterns is reduced, which causes, for examples, peeling of the heater element.

In case of a substrate made of an oxide such as $Al_2O_3$ (aluminum oxide), generation of bubbles hardly occurs, and peeling is hardly caused because glass is composed of an oxide component.

In a heater element composed of an alloy of Ag (silver) and Pd (palladium) as its main component, when the content of Pd (palladium) is high, the temperature coefficient of resistance (TCR) of the heater element is reduced, and temperature of the heater element raises in a short time period after applying electricity thereto. However, a problem may arise when temperature rises excessively and a temperature control circuit does not operate.

A heater, which is mounted in a tray made of high-temperature synthetic resin, is equipped in a toner fixing device of a copying machine. The heater is generally used at 180 to 230° C. for heating wax as one component of toner and for fixing toner images onto a paper. When temperature control of the heater cannot be performed properly by a failure of the temperature detection element or other reasons, power supply to the heater is not interrupted and an excessive current so flows into the heater that the heater element becomes red heat.

When the heater element is continuously red heat, the tray of synthetic resin mounting the heater, the frame of the fixing device, and a copy paper transferred toward the heater are burned. Other parts of the heater may also be affected by the red heat, such as carbonization by the red heat, or in an extreme case, it may cause smoke or fire though rarely.

The inventors studied on relations among the component ratio of an alloy of Ag (silver) and Pd (palladium) forming a heater element of a heater, the amount of a glass material functioning as binding and resistance adjustment means and the additive amount of an additive (a filler) other than the glass material, TCR characteristics and generation of bubbles.

SUMMARY OF THE INVENTION

The present invention was developed with the foregoing views and is intended to reduce the cost of a heater element formed on a substrate for a heater and to obtain the heater element having less variance in resistance among the heater elements manufactured and having the resistance falling within a predetermined ranges and minimize its fluctuations regardless of heat cycles by on and off power supply to the heat element and of use of the heater element under high temperature operational conditions. Furthermore, the present invention is intended to provide a heater preventing from the generation of bubbles between the substrate, wiring conductor, and overcoat layer and the glass and further preventing or reducing peeling of the heater element. The present invention is also intended to provide a fixing device using the heater, and an image forming apparatus with the fixing device.

The heater of the present invention has a substrate composed of a heat-resistant and electrically insulating material, a heater element formed on the surface of the substrate in a belt-shape in the longitudinal direction containing an alloy of Ag and Pd having a weight ratio Ag/Pd of 90/10 to 70/30, glass, and an inorganic oxide and/or an inorganic nitride of 0.1 to 20 wt % to the weight of the alloy of Ag and Pd, and a power supply terminal part formed in connection with the heater element.

The heater of the present invention may be a heater having a substrate composed of a heat-resistant and electrically insulating material, a heater element formed on the surface of the substrate in a belt-shape in the longitudinal direction containing an alloy of Ag and Pd having a weight ratio Ag/Pd of 90/10 to 70/30, a glass member and an inorganic oxide and/or an inorganic nitride as additive members, wherein a weight ratio of said additives is 10 to 70% to the weight of said alloy of Ag and Pd, and a power supply terminal part formed in connection with said heater element.

When the weight ratio x of the glass and inorganic oxide and/or inorganic nitride to the alloy of Ag and Pd and the formed sheet resistance y satisfy the following formula, the heater element of the heater can obtain a wider sheet resistance range:

$$y=ae^{bx}$$

where a and b are respectively within the ranges of $0.01 \leq a \leq 0.03$ and b=0.08 to 0.12.

The present invention can be applied to a fixing device having a pressure roller in press contact with a recording medium and a heating device arranged opposite to the pressure roller for fixing an image formed on the recording medium, wherein the aforementioned heater is used for the heating device including the aforementioned heater element is arranged in opposite to the pressure roller.

The present invention is applied to an image forming apparatus having the above-mentioned fixing device and an image transferring device for adhering toner to an electrostatic latent image so as to form a toner image and transferring the toner image onto a recording medium.

BRIEF DESCRIPTION OF THE DRAWINGS

FIG. 7 shows another embodiment of the heater of the present invention, where

DETAILED DESCRIPTION OF THE INVENTION

The embodiments of a heater according to the present invention will be explained with reference to the accompanying drawings. The thickness and width of each layer of a heater element, a power supply terminal, wiring conductors, and an overcoat layer for a substrate shown in each drawing are bombastically shown and not proportional dimensionally. Further, the upper front and lower rear of each substrate are shown for explanation of the corresponding drawing and they may be inverse practically.

Figure 1:
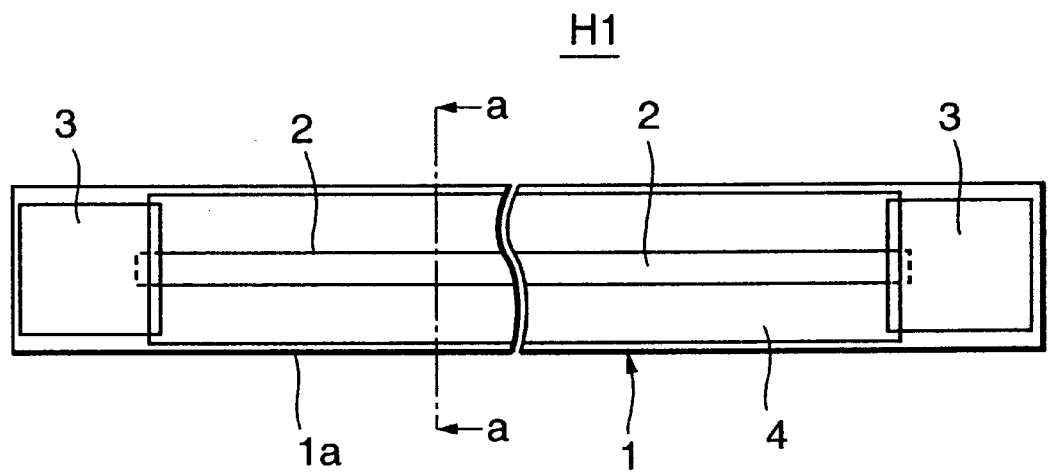
FIG. 1 is a front view showing a plate-shaped heater showing an embodiment of the present invention with the central part thereof notched.

FIG. 1 shows a plate-shaped heater H1 in which reference numeral 1 indicates an elongated substrate composed mainly of an electrically insulating nitride ceramics material, for example, AlN (aluminum nitride), and the length is about 300 mm (280 to 320 mm), and the width is about 6 mm (5 to 13 mm), and the thickness is about 0.7 mm (0.5 to 1.0 mm). In addition to AlN (aluminum nitride), a substrate may be formed from a nitride ceramics material such as $Si_3N_4$ (silicon nitride), an oxide ceramics material such as $Al_2O_3$ (aluminum oxide), or a carbide ceramics material such as SiC (silicon carbide).

A belt-shaped heater element 2 formed along the longitudinal direction on a front surface 1a of the substrate 1. An alloy of Ag (silver) and Pd (palladium) with a length of about 280 mm, a width of about 2 mm, and a thickness of about 10 $\mu$m is used as a conductor component. $Al_2O_3$ (aluminum oxide) as an electrically insulating inorganic oxide as a filler and a glass frit as a binding material are added to the conductor component. The glass frit operates not only as the binding material but also as a resistance adjustment material for the heater element 1 because it is an electrical insulator.

A terminal part 3, which is composed of a wide film-shaped electrode, is layered on each one end of the heater element 1 for supplying power thereto the heater element 1.

Each terminal part 3 has thick conductive films composed mainly from an alloy of Ag (silver) and Pt (platinum) with a length of about 6 mm and a width of about 5 mm. The terminal parts 3 for power supply may be formed so as to make the film thicker and the resistance lower.

A glassy overcoat layer 4 composed of a glass member of $SiO_2$ (silicon oxide)—ZnO (zinc oxide)—$Al_2O_3$ (aluminum oxide) in which $SiO_2$ (silicon oxide) is a main component is further formed on the substrate 1 along the heater element 2. As shown in FIG. 1, the glassy overcoat layer 4 having a film thickness of 20 to 100 μm is provided only small portion of the power supply terminal part 3. The overcoat layer 4 prevents the heater element 2 from degrading by oxidation or sulfuration. It then prevents the resistance of the heater element 2 to vary its value. It also protects the heater element 2 from wearing due to the mechanical contacts thereto.

Figure 2:
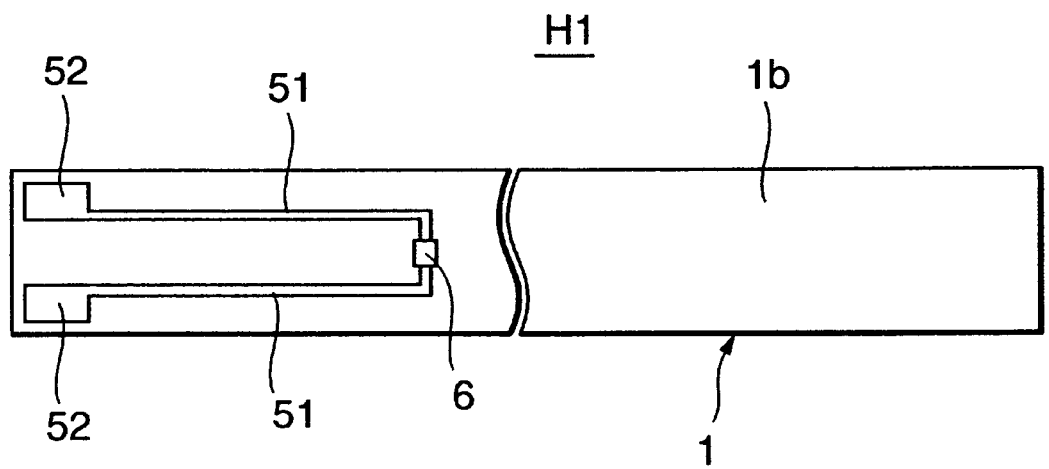
FIG. 2 is a rear view of the plate-shaped heater shown in FIG. 1.

As shown in FIG. 2, wiring conductors 51, 51 are formed on a rear surface 1b of the substrate 1. The material of the conductor 51 is the same as that of the terminal part 3. Terminal parts 52, 52 respectively connecting to the wiring conductors 51 and 51 are provided. The wiring conductors 51 and 51 are connected through a temperature detection sensor 6 such as a thermistor.

The sensor 6 is an NTC element and has a large negative temperature coefficient. Accordingly, when temperature rises the resistance of the sensor 6 becomes lower.

Composition and structure of the sensor 6 will be explained hereunder. The sensor 6 has a flat plate ceramics substrate of $Al_2O_3$ (aluminum oxide). A heat sensitizing portion of the sensor 6 is arranged on and projected from the central portion of the substrate. The heat sensitizing portion has a thin film formed with a mixture of oxides ($MnO_2$, $CO_3O_4$, $NiO$) of Mn (manganese), Co (cobalt), and Ni (nickel). Electrode portions, which are connected to the heat sensitizing portion, are formed with a Pt (platinum) layer.

The sensor 6 thus made is so mounted to the rear surface 1b of the substrate 1 that the heat sensitizing portion contacts with the rear surface 1b of the substrate 1. The electrode portion is joined to the wiring conductors 51 and 52 respectively with a conductive adhesive of a mixture of powder of alloy of Ag (silver) and Pd (palladium) with resin.

Next, the manufacture of the plate-shaped heater H1 will be explained. Firstly, the following items are prepared. (a) the elongated substrate 1 composed of AlN (aluminum nitride) and (b) paste for heater element 2, wherein the paste has a mixture of alloy powder of Ag (silver) of 80 wt % and Pd (palladium) of 20 wt %, amorphous glass frit powder of $SiO_2$ (silicon oxide)—$Al_2O_3$ (aluminum oxide) as a binder and for adjusting the electrical resistance, the amount of the glass frit being about 20 wt % of the Ag (silver)—Pd (palladium) alloy powder, inorganic oxide powder of $Al_2O_3$ (aluminum oxide) as a filler, the amount of inorganic oxide powder being about 10 wt % of to the total weight of the Ag (silver)—Pd (palladium)alloy powder, ethyl cellulose (organic binder) and an organic solvent such as or terpineol.

In order to obtain the elongated heater element, a thick belt shape film of the paste is coated by a screen printing method on the front surface 1a of the substrate 1. Thereafter, the coating film is dried and fired in a furnace for about 10 minutes at a peak temperature of about 850° C. (the elapsed in the oven for about 40 minutes). The solvent in the paste is evaporated and the organic binder is decomposed and burned out, and the glass component of the inorganic as the binder is fused so that the alloy of Ag (silver) and Pd (palladium) and the powder of inorganic oxides are fixed on the front surface 1a of the substrate 1. Thus the heater element 2 is formed on the substrate 1.

Then, in order to obtain conductive terminals 3 and 3, the wiring conductors 51 and 51, and the terminal portions 52 and 52 at each end of the surface of the rear 1b of the substrate 1, a conductive paste composed of an alloy of Ag (silver) and Pt (platinum) is used. The conductive paste is coated on the substrate 1 by a screen printing method. After drying the printed paste, it is fired by the same way done in obtaining the heater element 2.

Thereafter, the overcoat layer 4 is formed. In order to obtain the overcoat layer 4, paste for the overcoat is prepared. The paste is glass paste composed of a mixture of glass powder of $SiO_2$ (silicon oxide)—ZnO (zinc oxide)—$Al_2O_3$ (aluminum oxide) having $SiO_2$ (silicon oxide) as a main component, ethyl cellulose (organic binder material) and an organic solvent. The paste is so coated on the front surface 1a of the substrate 1 that coating areas are continuously extended from one terminal parts to the other terminal parts on the substrate 1.

The coated film is dried and fired in a furnace for about 10 minutes at a peak temperature of about 850° C. (the elapsed in the furnace for about 40 minutes). The glassy overcoat layer 4 with a thickness of 15 μm to 100 μm is obtained.

The softening point of this glass is about 600 to 800° C., which is lower than the firing temperature of the paste for the heater element 2. When the firing temperature is raised, the glass paste printed on the front surface 1a of the substrate 1 is fused. A smooth glassy overcoat layer 4 with a flat and even surface is thus obtained.

Furthermore, the sensor, at the final manufacturing step, is joined to the wiring conductors 51 and 51 with a conductive adhesive formed by mixing alloy powder of Ag (silver) and Pd (palladium) with an organic binding material.

Figure 4:
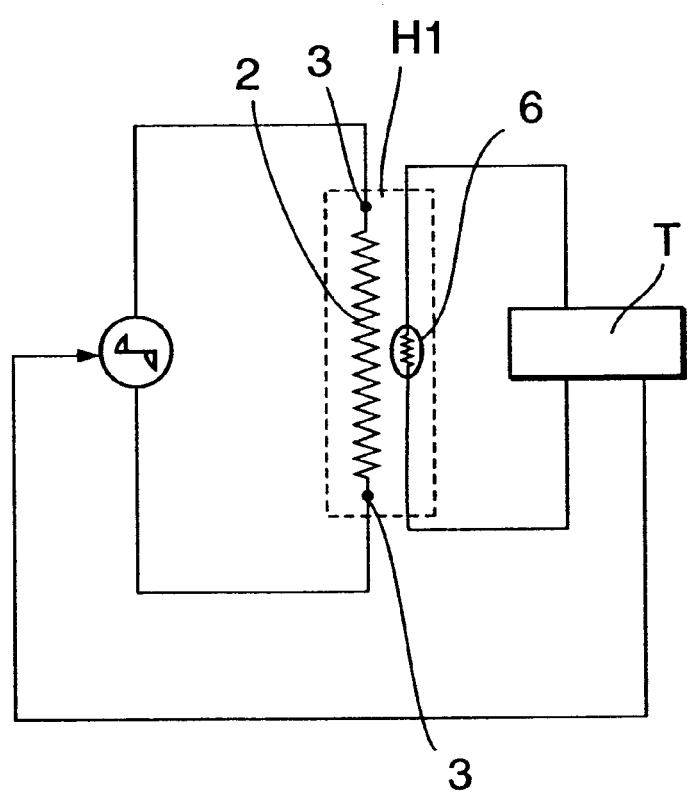
FIG. 4 is an electric circuit used for the plate-shaped heater.

The plate-shaped heater H1 having such a constitution is energized by the circuit shown in FIG. 4. Namely, when power is supplied to the power supply terminal parts 3 and 3 via a temperature control circuit T, the heater element 2 generates heat. At this time, the sensor 6 starts its operation.

The substrate 1 also receives heat generated by the heater element 2 by thermal conduction and rises its temperature. The heat is then transferred to the heat sensitizing part of the sensor 6 attached to the rear surface 1b of the substrate 1, which varies the resistance of the heat sensitizing part. The change in the resistance of the heat sensitizing part is output to the terminal parts 52 and 52 via the wiring conductors 51 and 51. The temperature control circuit T, which judges whether temperature detected by the sensor 6 falls within a predetermined range or not and adjusts the power to be applied to the heater element 2, for example, by phase control so as to adjust the temperature. The temperature control is not limited to phase control of the power but the temperature may be adjusted by another controlling methods, such as by controlling the voltage or current.

The sensor 6 having such constitution accurately receives the heat of the rear surface 1b of the substrate 1 of the heater H1, which turns to accurately detect temperature of the heater element 2. Detection signals by the sensor 6 can feed back to the temperature control circuit T, so that appropriate temperature control can be performed.

The sensor 6, even when the heater H1 is over-heated, generates a signal for stopping the power supply to the heater element 2 to prevent a trouble. Even if the temperature control circuit T does not operate and power supply to the heater element 2 is not interrupted, the heater element 2 of the heater H1 can prevents the thermal runaway. In addition to the temperature control circuit T, another safety devices such as a temperature fuse or a current fuse may be installed simultaneously.

The heater element 2 of the plate-shaped heater H1 having the aforementioned constitution is composed of a mixture of a conductive component of an alloy of Ag (silver) of about 80 wt % and Pd (palladium) of about 20 wt %, amorphous glass of $SiO_2$ (silicon oxide)—$Al_2O_3$ (aluminum oxide) of about 20 wt % to the weight of the alloy of Ag (silver) and Pd (palladium), and an inorganic oxide $Al_2O_3$ (aluminum oxide) as a filler of about 10 wt % to the weight of the alloy of Ag (silver) and Pd (palladium). The plate-shaped heater H1, which is obtained by the aforementioned constitution, can minimize its resistance changes regardless of heat cycles and performs stably for a long time period and no bubbles were observed on the interface between the heater element 2 and the thermally conductive AlN (aluminum nitride) substrate 1 in spite of the long time use of the heater H1. No peeling of the heater element 2 was observed in spite of the long time use of the heater H1.

The plate-shaped heater H1 generates constantly a predetermined amount of heat, and it can elevate the overall temperatures of the substrate 1 almost uniformly in a short time after supplying power thereto because it uses the AlN (aluminum nitride) substrate 1 with high thermal conductivity. Thus uneven temperature distributions at parts of the heater H1 are reduced.

Further, the plate-shaped heater H1, even if the temperature control circuit T breaks down and the power supply continues, is suppressed from abnormal temperature rise because the TCR value is not small. The heater H1 or other parts can be prevented from an accident such as burning, carbonizing, flaming, or ignition.

Having being added an inorganic oxide such as $Al_2O_3$ (aluminum oxide), which has a superior heat resistance and weather resistance, the amount of binding glass in the heater element 2, which is apt to be degraded due to the heat cycle and exposure of hot temperature, is reduced. The heater element 2 of the plate-shaped heater H1 keeps its initial resistance or keeps its value within a predetermined range even after the long period of the use.

Further, the alloy of Ag (silver) and Pd (palladium) as a conductive component of the heater element 2 constituting the plate-shaped heater H1 of the present invention has a ratio of 70 to 90 wt % of Ag (silver): 10 to 30 wt % of Pd (palladium). On the other hand, the amount of amorphous glass to be added to the alloy of Ag (silver) and Pd (palladium) as a binder and a resistor component, is within the range from 3 to 50 wt % to the weight of the alloy of Ag (silver) and Pd (palladium). The amount of inorganic oxide to be added as a filler is within the range from 0.1 to 20 wt % to the weight of the alloy of Ag (silver) and Pd (palladium). When Ag (silver) of the alloy of Ag (silver) and Pd (palladium) as a conductive component of the heater element 2 is less than 70 wt % and Pd (palladium) is more than 30 wt %, the TCR becomes smaller such as less than 200 ppm/° C., so that when the temperature control circuit becomes abnormal, the heater is overheated instantaneously. When Ag (silver) is more than 90 wt % and Pd (palladium) is less than 10 wt %, the TCR becomes more than 1000 ppm/° C., so that the startup characteristics of the heater H1 get worse. The preferable ratio range is from 73 to 87 wt % of Ag (silver) and from 13 to 27 wt % of Pd (palladium) or so.

When the weight of the inorganic oxide to the weight of the alloy of Ag (silver) and Pd (palladium) is less than 0.1 wt %, much glass must be needed for resistance adjustment of the heater element. In this instance, bubbles are generated among the substrate, the wiring conductor and the glass of the overcoat layer, and the resistance of heater element fluctuates greatly. If the weight of the inorganic oxide is more than 20 wt %, the adhesion strength of the film of the heater element is reduced and the film is undesirably apt to peel.

When the weight of glass to the weight of the alloy of Ag (silver) and Pd (palladium) is less than 3 wt %, the adhesion strength of the film of the heater element is reduced so that the film is apt to peel. When the weight of glass is more than 50 wt %, bubbles occurs among the substrate, the wiring conductor and the glass of the overcoat layer, and the resistance of the heater element varies greatly.

When the ratio of the alloy of Ag (silver) and Pd (palladium) for functioning as a conductive component for forming the heater element 2 to an insulating material composed of amorphous glass for functioning as a resistor component to be added to the alloy and an inorganic oxide as a filler is selected in a well-balanced state, for example, by controlling the total weight of the glass and inorganic oxide to the weight of the alloy of Ag (silver) and Pd (palladium) to more than 10 wt %, the aforementioned operational effect can be obtained.

In this case, the weight ratio X/Y of amorphous glass X to inorganic oxide Y is 1/1 to 5/1 and the weights of the two to the weight of the alloy of Ag (silver) and Pd (palladium) are 10 to 70 wt %. When the content of glass and an inorganic oxide or an inorganic nitride is less than 10 wt % of the weight of the alloy of Ag (silver) and Pd (palladium), the resistance of the heater elements does not become a high resistance of 100 mΩ to several Ω/□, thus it is necessary to increase the total length of the heater element and to narrow the width thereof. The degree of freedom of pattern design of the heater element is lost. When the content of the alloy of Ag (silver) and Pd (palladium) is more than 70 wt % of the total weight, bubbles occurs due to the reaction of the heater element with the substrate, the conductor, and glass of the overcoat layer, which results in varying the resistance of the heater element greatly.

When the weight ratio X/Y of amorphous glass X to inorganic oxide Y is more than 5/1, the resistance of the heater element is increased and bobbles occurs due to the reaction of the heater element with the substrate, the conductor, and glass of the overcoat layer among due to a reaction on the substrate, wiring conductor, and glass of the overcoat layer. When the weight ratio is less than 1/1, the heater elements becomes porous and the adhesion with the substrate is reduced, which affects quality and reliability of the heater element.

As for an example of an inorganic oxide, which has superior heat resistance, weather resistance and electric insulation property, $Al_2O_3$ (aluminum oxide) is named and explained, however, an inorganic oxide to be added to the heater element is not limited to $Al_2O_3$ (aluminum oxide) according to the present invention, $SiO_2$ (silicon oxide), $TiO_2$ (titanium oxide), $ZrO_2$ (zinc oxide), or $2MgO.2Al_2O_3.5SiO_2$ (codierite) may be used. In place of an inorganic oxide, an inorganic nitride, for example, AlN (aluminum nitride) may be used, or at least one kind selected from inorganic oxides and inorganic nitrides can be used.

By adding these inorganic oxides and inorganic nitrides, the additive amount of glass functioning as resistance adjustment can be reduced and generation of bubbles among the substrate, the wiring conductor and the glass of the overcoat layer is prevented. Variance in resistance values among the heater elements manufactured is kept small and its value will not varied even after the use.

During the formation of the glassy overcoat layer, glass may react with the heater element in the lower layer. However, an additive of an inorganic oxide or an inorganic nitride can prevent the reaction and it minimizes the change in resistance of the heater element.

Further, amorphous glass to be added to form the heater element 2 of the present invention also functions as a binder for the heater element but functions for regulating the resistance of the heater element 2 since it has electric insulation property. The resistance is then regulated depend on the amount of the amorphous glass. As for the glass, at least one kind of glass selected from the ZnO (zinc oxide)—$SiO_2$ (silicon oxide), $B_2O_3$ (boron oxide)—ZnO (zinc oxide), or $SiO_2$ (silicon oxide)—$Al_2O_3$ (aluminum oxide) or glass of the $SiO_2$ (silicon oxide)—$Al_2O_3$ (aluminum oxide)—CaO (calcium oxide) or glass of $B_2O_3$ (boron oxide)—BaO (barium oxide)—ZnO (zinc oxide) can be used.

When crystallized glass working as a binder loses its fluidity by heat, the heater element is apt to be porous. On the other hand, the amorphous glass in fused state has fluidity and a fine structured heater element is obtained.

Crystallized glass has different crystalline states, which is apt to change the resistance of the heater element. Accordingly, use of amorphous glass prevents the change in resistance after long period use.

In order to obtain the heater element 2, it is possible to use two amorphous glass components of $SiO_2$ (silicon oxide)—$Al_2O_3$ (aluminum oxide)—CaO (calcium oxide) and $B_2O_3$ (boron oxide)—BaO (barium oxide)—ZnO (zinc oxide), and an inorganic oxide component of $Al_2O_3$ (aluminum oxide) as a filler, the weight ratio of the three components being 1.0 to 1.5:1.0 to 1.5:0.2 to 1.0. The heater element 2 thus obtained can prevent its resistance from changing while, and can increase its adhesion to the substrate 1, thereby no peeling occurs.

The two amorphous glass components are useful to adjust the resistance of the heater element 2 while the organic oxide component $Al_2O_3$ (aluminum oxide) is useful to adjust the resistance and prevents generation of bubbles, which enables the heater element 2 to have the resistance falling in a wide range of its value.

Materials constituting the heater element 2, such as a conductor component, an inorganic oxide, inorganic nitride, and glass, and the amount thereof may be selected properly depending on the operational conditions, characteristics and shapes of the heater element 2.

Figure 5:
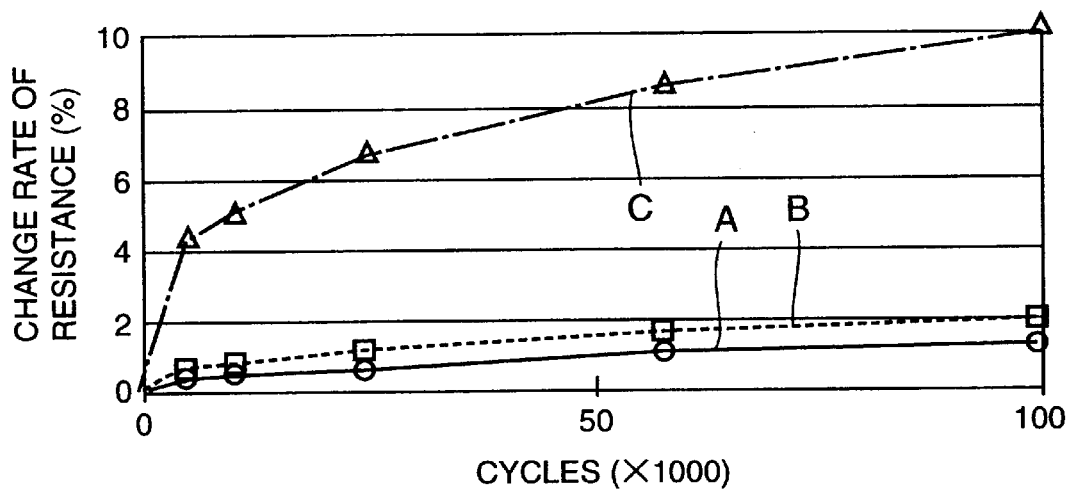
FIG. 5 is a graph showing the relation between the power supply on-off cycles and the resistance change rate.

In the graphs shown in FIG. 5, the transverse axis indicates the on-off cycle (the number of times, power supply for 10 seconds and non-power supply for 60 seconds are repeated), and the ordinate axis indicates the change rate of resistance (%). Solid line A is a graph of the heater H1 of the present invention (the weight ratio of Ag (silver) and Pd (palladium) is 80 wt %:20 wt %). The dotted line B and the dashed line C are graphs of conventional types of heater elements. In the graph B, the weight ratio of Ag (silver) and Pd (palladium) is 50 wt %:50 wt %, while in the graph C, the weight ratio of Ag (silver) and Pd (palladium) is 70 wt %:30 wt %.

It is apparent that the change rate of resistance of the heater (graph C) is increased by the increase of on-off cycles while the change rate is quite small in the heater of the present invention (graph A). Further, the change rate of resistance of the present invention (graph A) is almost similar to that of the conventional heater (graph B), although the ratio of Pd (palladium) in the heater of the present invention is 50%.

If the TCR (resistance temperature coefficient) is small, the plate-shaped heater heats up soon after supplying power to the heater element. In case the temperature control circuit becomes abnormal, the heater element becomes hot red, or a high temperature instantaneously. However, if TCR value is designed to 200 to about 1000 ppm/° C. as that of the heater element according to the present invention, heat-up speed is so suppressed even if the temperature control circuit becomes abnormal that carbonization, smoking or flaming of the substrate or other members of the heater are prevented or delayed.

The inventors confirm that if the following relational expression between a weight ratio x of amorphous glass and an inorganic oxide and/or an inorganic nitride to an alloy of Ag and Pd as a conductive component of the heater element 2 and the sheet resistance y of the heater element 2 satisfies, a wide sheet resistance ranging from several 10 m$\Omega$/□/10 $\mu$m to several $\Omega$/□/10 $\mu$m is obtained, and that the variance in the resistance among heater elements of the plate-shaped heaters manufactured are small. Thus, the plate-shaped heater according to the invention can perform stably and inexpensive plate-shaped heater using reduced amount of Pd (palladium) are obtained.

$$y = ae^{bx}$$

where a and b are factors, and $0.01 \leq a \leq 0.03$, and b=0.08 to 0.12.

Figure 6:
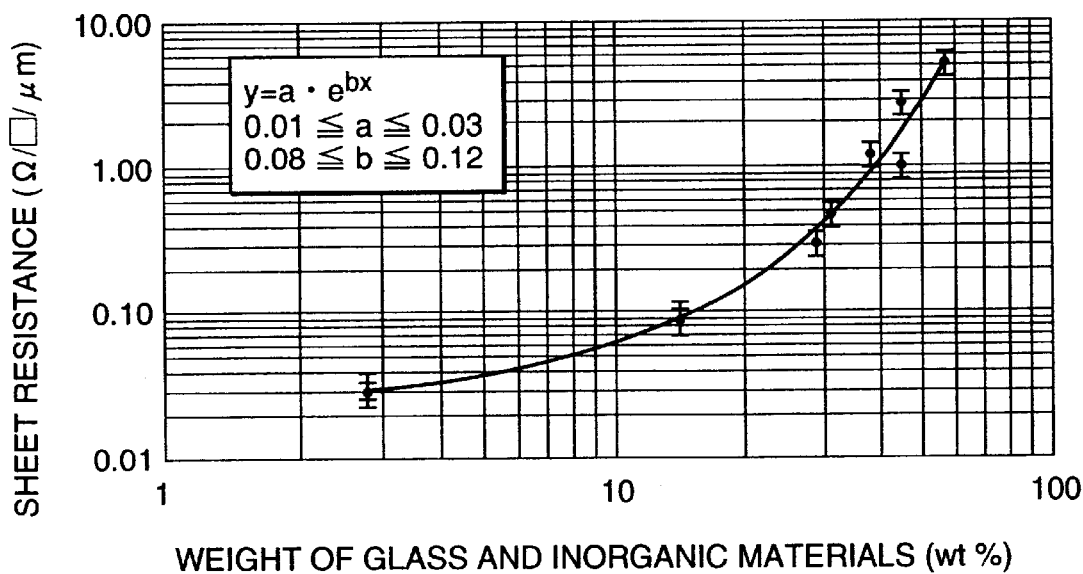
FIG. 6 is a graph showing the relation between the weight ratio of amorphous glass and inorganic materials and the sheet resistance.

FIG. 6 is a graph (logarithm) showing the sheet resistance y($\Omega$/□/10 $\mu$m) against the weight ratio x of the amorphous glass, and an inorganic oxide and/or an inorganic nitride to an alloy of Ag and Pd. As clearly shown in the graph, desired resistance of the heater element 2 can be easily obtained by properly arranging the weight ratio x of the amorphous glass, and an inorganic oxide and/or an inorganic nitride to an alloy of Ag and Pd. From the graph it is observed that variance in resistance among heater elements manufactured is small.

As explained above, the plate-shaped heater H1 has the glassy overcoat layer 4 formed on the surface of the heater element 2 and the substrate 1. Glass material used for the overcoat is not limited to the glass of $SiO_2$ (silicon oxide)—ZnO (zinc oxide)—$Al_2O_3$ (aluminum oxide), but glass materials indicated below may be used.

As another glass materials for forming the overcoat layer 4, glass of PbO (lead oxide)—$B_2O_3$ (boron oxide)—$SiO_2$ (silicon oxide), glass of ZnO (zinc oxide)—$SiO_2$ (silicon oxide)—BaO (barium oxide), glass of $SiO_2$ (silicon oxide)—$B_2O_3$ (boron oxide)—$Al_2O_3$ (aluminum oxide), glass of $SiO_2$ (silicon oxide)—$B_2O_3$ (boron oxide)—ZnO (zinc oxide), and glass of $SiO_2$ (silicon oxide)—$B_2O_3$ (boron oxide)—$Na_2O$ (sodium oxide) are available. These materials perform the same function as the aforementioned glass material. Further they had little reaction with the heater element.

When a filler such as $SiO_2$ (silicon oxide), AlN (aluminum nitride), BN (boron nitride), or SiC (silicon carbide) is additionally added to these glass materials, the thermal conductivity can be improved.

Figure 3:
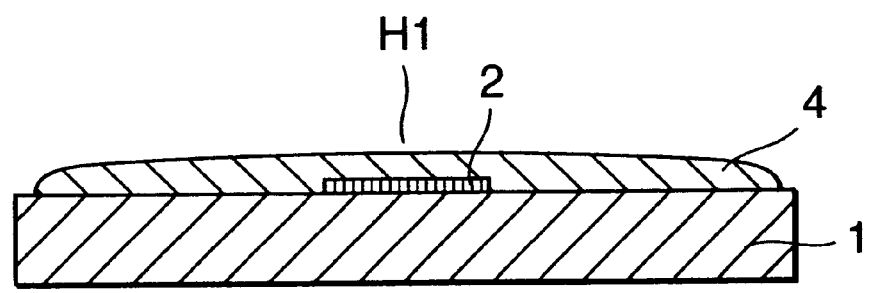
FIG. 3 is a longitudinal cross sectional view of the enlarged part cut along the line a—a shown in FIG. 1.
Figure 7A:
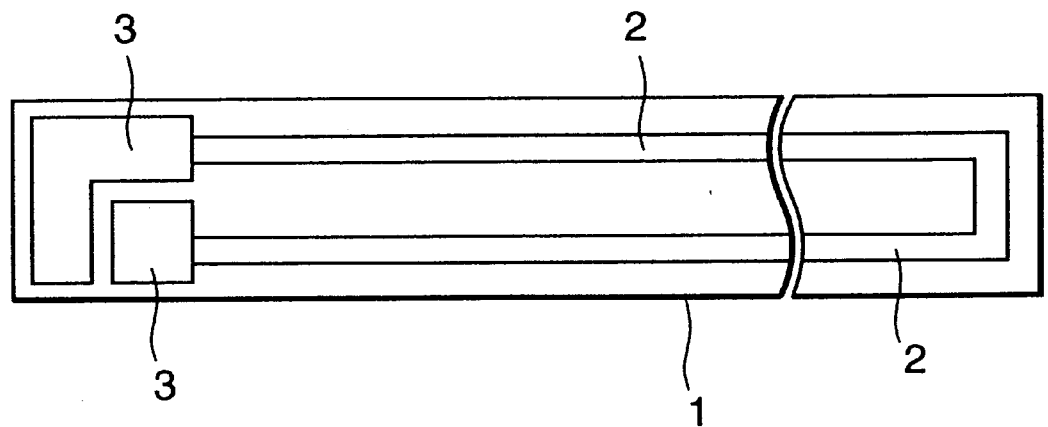
FIG. 7a is a front view.
Figure 7B:
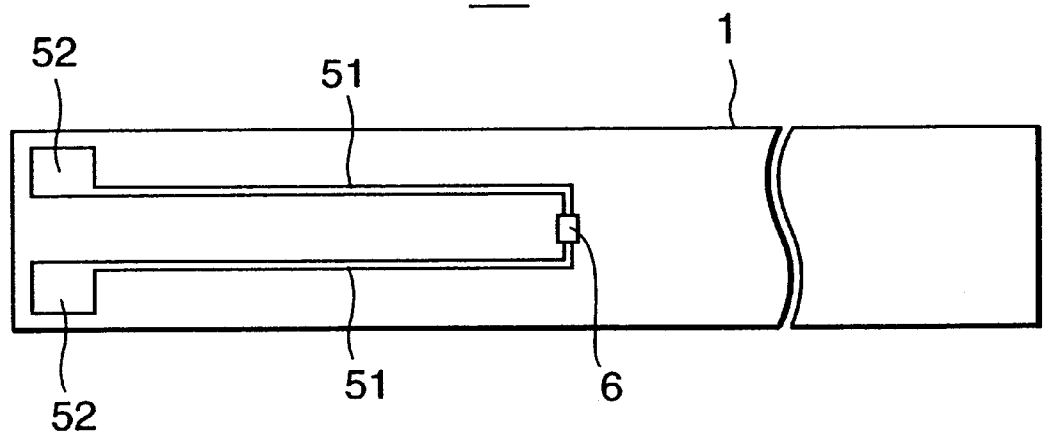
FIG. 7b is a rear view.

Next, a plate-shaped heater H2 as another embodiment of the present invention will be shown in FIG. 7. In the drawings, the same reference numerals are assigned to the same parts as those shown in FIGS. 1 to 3 and the explanation thereof will be omitted.

The plate-shaped heater H2 shown in this embodiment has film-shaped terminal parts 3 and 3 arranged at one end of a substrate 1 for power supply and a U-shaped heater element 2 connected to the power supply terminal parts 3 and 3. Further, materials for the substrate 1, the heater element 2 and an overcoat layer 4 and structures thereof are the same as those shown in the aforementioned embodiment. The plate-shaped heater H2 performs the same operation and has the same effects as those of the plate-shaped heater H1 in the aforementioned embodiment.

In the same way as with the plate-shaped heater H1, a sensor 6 for detecting temperature, such as a thermistor can be use in the plate-shaped heater H2. A thermocouple, or a thermostat is also used, however the temperature sensor 6 is not essential. Needless to say, the arrangement of the sensor 6 ensures accurate temperature management and safety operation of the heater H2.

Figure 8:
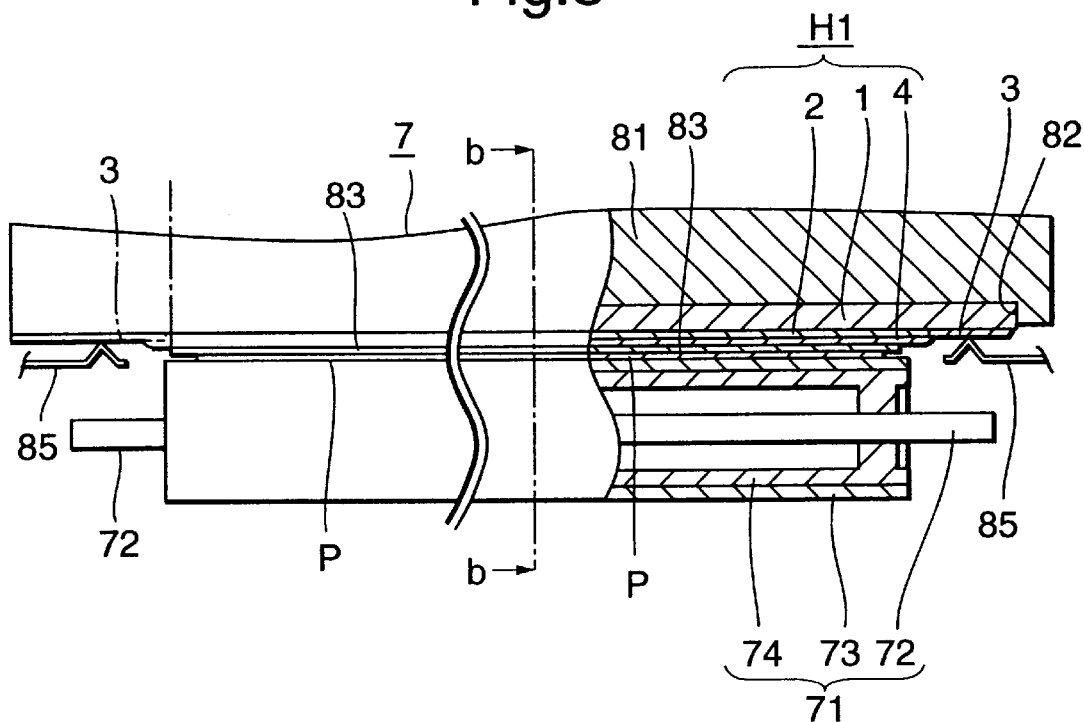
FIG. 8 is a longitudinal cross sectional partial view of a fixing device for a copying machine incorporating a plate-shaped heater according to the present invention.
Figure 9:
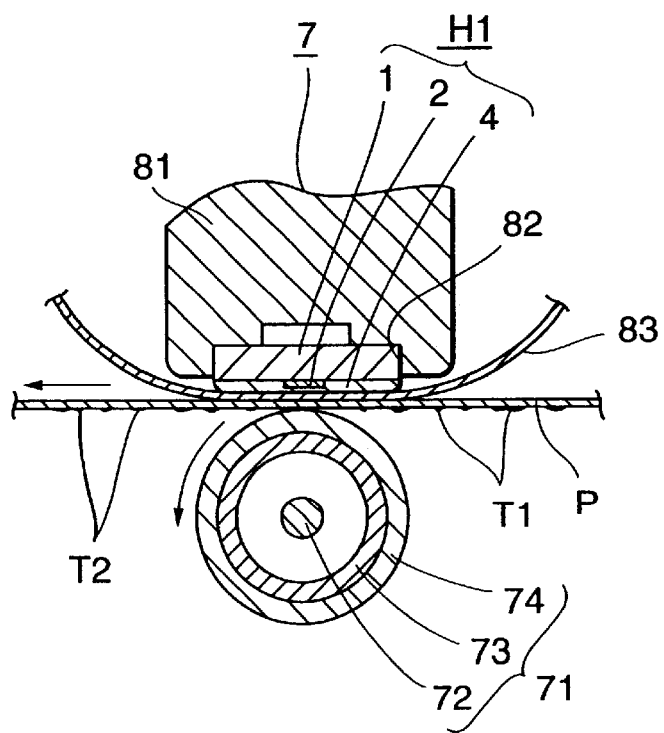
FIG. 9 is an enlarged cross sectional view showing the section along the line b—b shown in FIG. 8.

Next, a fixing device 7 in which the plate-shaped heater H1 is incorporated will be explained. The embodiment thereof is shown in FIGS. 8 and 9. The fixing device 7 is for a copying machine. The heater H1 shown in the drawing is the same as that shown in the aforementioned embodiment, so that the explanation thereof will be omitted.

In FIGS. 8 and 9., reference numeral 71 indicates a pressure roller. On both end faces the pressure roller 71, a revolving shaft 72 born by a drive unit (not shown in the drawing) is projected. A heat-resistant elastic element, for example, a silicon rubber layer 74 is fit into the surface of a cylindrical roller body 73 formed on the outer periphery of the revolving shaft 72.

A heater support 81 is arranged in opposite to the revolving shaft 72 of the pressure roller 71. In a recessed portion 82 of the support 81, the plate-shaped H1 is disposed in parallel with the pressure roller 71. Further, around the support 81 in which the heater H1 is equipped a fixing film 83 composed of a heat-resistant sheet such as polyimide resin in an endless roll shape is wound so as to freely rotate.

And, the smooth surface of the glassy overcoat layer 4 formed on the upper side of the heater H1 is in elastic contact with the silicon rubber layer 74 of the pressure roller 71 via the fixing film 83. Symbol P shown in the drawing indicates a recording medium to be heated such as a copy paper or a copy film. T1 on the copy paper P indicates a printed unfixed toner image, and T2 indicates a fixed toner image.

The fixing device 7 fixes the unfixed toner image T1 transferred to the copy paper P.

In the fixing device 7, the plate-shaped heater H1 is energized via connectors 85 and 85 which is in contact with the terminal parts 3 and 3. The connectors 85 and 85 are made by bending a phosphor bronze plate and they are give elasticity. The pressure roller 71 is rotated by the drive unit in a state that the heater element 2 generates heat and rises at a predetermined temperature. In correspondence with the rotation of the pressure roller 71, the fixing film 83 also rotes around the heater support 81 in sliding contact with the surface of the overcoat layer 4 covering the plate-shaped heater H1.

When the copy paper P onto which the unfixed toner image T1 is formed is transferred to the fixing device 7, the copy paper P goes in the direction of the arrow shown in the FIG. 9. While the copy paper passes through the fixing device 7, it is held and pressed by the silicon rubber layer 74 of the pressure roller 71 and the surface of the fixing film 83. At that time, the unfixed toner image T1 on the copy paper P is heated by the heater element 2 so that the toner image T2 is fixed on the copy paper P.

Namely, a part of the unfixed toner image at a take-in portion of the pressure roller 71 is firstly heated through the fixing film 83 by heat generated by the heater H1, at least temperature thereof largely exceeds the fusing point of the toner thereby the tone is soften and fused completely. A part of fixed toner image is thus obtained on the paper. Similarly, the rest of the parts of the unfixed image are turned to the fixed image as the paper moved by the pressure roller 71. As the copy paper P goes away from the heater H1, the fixed toner image gradually cooled and solidified. The fixing film 83 is separated from the copy paper P at a take-out portion of the pressure roller 71.

Since the grassy overcoat layer 4 on the heater element has a smooth surface, the fixing film 83 slid on the surface is easily transferred together with the copy paper p by rotation of the pressure roller 71. Preferred fixing with less bleeding of toner can be realized. When the plate-shaped heater H1 becomes faulty and a thermal runaway occurs, power supply is interrupted. In the fixing device, a protective element, which does not disturb transmission of the heat may be disposed between the plate-shaped heater and a copying medium to be heated.

Next, a copying machine as an image forming apparatus according to the present invention will be explained with referring to FIG. 10. A copying machine 9 has a plate-shaped heater H1 and a fixing device 7. The fixing device 7 equipped in the copying machine is the same as that of the mentioned above, the same reference numerals are assigned to the same parts and the explanation thereof will be omitted.

Figure 10:
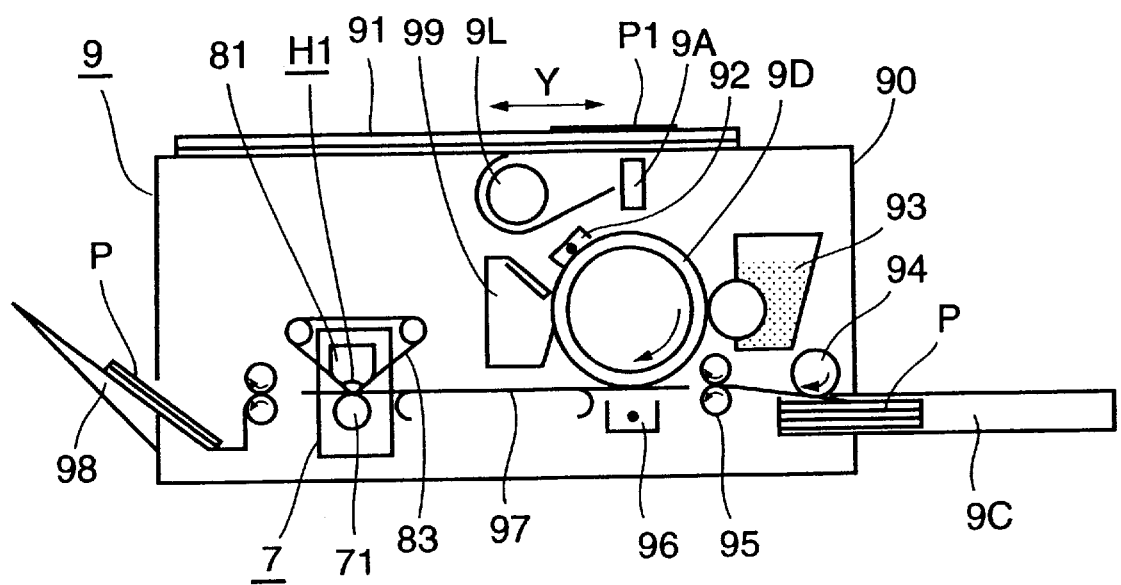
FIG. 10 is a longitudinal cross sectional partial view showing the rough constitution of an image forming apparatus incorporated in the fixing device shown in FIG. 8.

In FIG. 10, reference numerals 90 and 91 indicate a frame body of the copying machine 9 and a document tray, respectively. The tray 91, which has a top plate made of a transparent member like glass mounted on the frame body 90 for receiving a document P1, can move back and forth in the direction of the arrow Y for scanning the documents P1.

In the flame body 90, there is provided a lighting apparatus 9L, which is composed of an illumination lamp and a reflecting mirror. The document P1 is illuminated by the lighting apparatus 9L and its reflected light from the document p1 is slit-exposed onto a photosensitive drum 9D by a focusing element, such as an image array element 9A with short focus and small diameter. The photosensitive drum 9D rotates in the direction of the arrow.

A charger 92, which uniformly charges the surface of the photosensitive drum 9D, has a coating of a zinc oxide photosensitive layer or an organic semiconductor photosensitive layer. By exposing light on the charged drum 9D with the imaging element array 9A, an electrostatic latent image is formed on the drum 9D. The electrostatic latent image is visualized with toner stored in a vessel 93.

The copy paper P stored in a cassette C is sent onto the drum 9D by a pair of transfer rollers 95. The transfer rollers 95 in press contact with each other rotate in synchronism with a feed roller 94 and the photosensitive drum 9D. The toner image formed on the photosensitive drum 9D is transferred onto the copy paper P by a transfer discharger 96.

Thereafter, the paper P separated from the drum 9D is sent to the fixing device 7 along a transfer guide 97. After heating or fixing process, the paper p is ejected into a tray 98, and the residual toner on the drum 9D is cleaned or removed by a cleaner 99.

Length of the heater element 2 in the fixing device 7 is longer than the effective length corresponding to the width (length) of the maximum size paper to be used for copying with he copying machine 9. A feed pressure roller 71 is arranged in opposite to the heater element 2 so as to slightly contact with it.

The unfixed toner image T1 on the paper P to be sent between the heater H1 and the pressure roller 71 is fused by heat from the heater element 2 so that a copied image of characters, alphanumeric characters, symbols, and drawings are presented on the paper P.

The copying machine 9 like this can has the same operational effect as that described in the fixing device 7, that is, it can prevent an accident due to overheating by the fixing beater.

Further, the present invention is not limited to the aforementioned embodiments. In the aforementioned embodiments, the plate-shaped heater is used for fixing the toner image with the copying machine. However, it can be also applied to other office automation devices such as a printer and a facsimile. Further, it can be used for heating not only in office automation devices but also in household electric appliances, precision machine, and chemical reactor devices.

What is claimed is:

1. A heater, comprising:
   a substrate composed of a heat-resistant and electrically insulating material,
   a heater element formed on a surface of said substrate in a belt-shape in a longitudinal direction containing an alloy of Ag and Pd having a weight ratio Ag/Pd of 90/10 to 70/30, a glass member, and an inorganic oxide and/or an inorganic nitride having a weight ratio of 0.1 to 20% to the weight of said alloy of Ag and Pd, and
   a power supply terminal part formed in connection with said heater element.

2. A heater, comprising:
   a substrate composed of a heat-resistant and electrically insulating material,
   a heater element formed on a surface of said substrate in a belt-shape in a longitudinal direction containing an alloy of Ag and Pd having a weight ratio Ag/Pd of 90/10 to 70/30, a glass member and an inorganic oxide and/or an inorganic nitride as additive members, wherein a weight ratio of said additives is 10 to 70% to the weight of said alloy of Ag and Pd, and
   a power supply terminal part formed in connection with said heater element.

3. A heater according to claim 1, wherein said heater element has a following relational expression between a weight ratio x of said glass and said inorganic oxide and/or said inorganic nitride to said alloy of Ag and Pd and a formed sheet resistance y:

$$y = ae^{bx}$$

where a and b are factors, and $0.01 \leq a \leq 0.03$, and $b = 0.08$ to $0.12$.

4. A heater according to claim 2, wherein said heater element has a following relational expression between a weight ratio x of said glass and said inorganic oxide and/or said inorganic nitride to said alloy of Ag and Pd and a formed sheet resistance y:

$$y = ae^{bx}$$

where a and b are factors, and $0.01 \leq a \leq 0.03$, and $b = 0.08$ to $0.12$.

5. A heater according to claim 1, wherein said inorganic oxide or said inorganic nitride in said heater element is composed of at least one of $SiO_2$, $Al_2O_3$, $TiO_2$, $ZrO_2 \cdot SiO_2$, $2MgO \cdot 2Al_2O_3 \cdot 5SiO_2$, and AlN.

6. A heater according to claim 2, wherein said inorganic oxide or said inorganic nitride in said heater element is composed of at least one of $SiO_2$, $Al_2O_3$, $TiO_2$, $ZrO_2 \cdot SiO_2$, $2MgO \cdot 2Al_2O_3 \cdot 5SiO_2$, and AlN.

7. A heater according to claim 1, wherein said glass member is composed of at least one of amorphous glass of $ZnO$—$SiO_2$, $B_2O_3$—$ZnO$, and $SiO_2$—$Al_2O_3$.

8. A heater according to claim 2, wherein said glass member is composed of at least one of amorphous glass of $ZnO$—$SiO_2$, $B_2O_3$—$ZnO$, and $SiO_2$—$Al_2O_3$.

9. A heater according to claim 1, wherein said glass member is composed of amorphous glass of $SiO_2$—$Al_2O_3$—$CaO$ and amorphous glass of $B_2O_3$—$BaO$—$ZnO$.

10. A heater according to claim 2, wherein said glass member is composed of amorphous glass of $SiO_2$—$Al_2O_3$—$CaO$ and amorphous glass of $B_2O_3$—$BaO$—$ZnO$.

11. A heater according to claim 9, wherein an inorganic oxide composed of $Al_2O_3$ is added to said amorphous glass of $SiO_2$—$Al_2O_3$—$CaO$ and said amorphous glass of $B_2O_3$—$BaO$—$ZnO$ and a weight ratio of said inorganic oxide, said amorphous glass of $SiO_2$—$Al_2O_3$—$CaO$ and amorphous glass of $B_2O_3$—$BaO$—$ZnO$ is within a range of 0.2 to 1.0:1 to 1.5:1 to 1.5.

12. A heater according to claim 10, wherein an inorganic oxide composed of $Al_2O_3$ is added to said amorphous glass of $SiO_2$—$Al_2O_3$—$CaO$ and said amorphous glass of $B_2O_3$—$BaO$—$ZnO$ and a weight ratio of said inorganic oxide, said amorphous glass of $SiO_2$—$Al_2O_3$—$CaO$ and amorphous glass of $B_2O_3$—$BaO$—$ZnO$ is within a range of 0.2 to 1.0:1 to 1.5:1 to 1.5.

13. A heater according to claim 1, wherein surfaces of said heater element and said substrate have a glassy overcoat layer, and said overcoat layer is composed of at least one of glass material of glass of $PbO$—$B_2O_3$—$SiO_2$, glass of $ZnO$—$SiO_2$—$BaO$, glass of $SiO_2$—$ZnO$—$Al_2O_3$, glass of $BiO_2$—$B_2O_3$—$Al_2O_3$, glass of $SiO_2$—$B_2O_3$—$ZnO$, and glass of $SiO_2$—$B_2O_3$—$Na_2O$.

14. A heater according to claim 2, wherein surfaces of said heater element and said substrate have a glassy overcoat layer, and said overcoat layer is composed of at least one of glass material of glass of $PbO$—$B_2O_3$—$SiO_2$, glass of $ZnO$—$SiO_2$—$BaO$, glass of $SiO_2$—$ZnO$—$Al_2O_3$, glass of $BiO_2$—$B_2O_3$—$Al_2O_3$, glass of $SiO_2$—$B_2O_3$—$ZnO$, and glass of $SiO_2$—$B_2O_3$—$Na_2O$.

15. A heater according to claim 1, wherein said substrate is composed of at least one of ceramics material of AlN, $Si_3N_4$, $Al_2O_3$, and SiC.

16. A heater according to claim 2, wherein said substrate is composed of at least one of ceramics material of AlN, $Si_3N_4$, $Al_2O_3$, and SiC.

17. A fixing element for fixing an image onto a recording medium and having a pressure roller arranged in press contact with said recording medium and a heater device, wherein said heater as claimed in claim 1 is used for said heater device and said heater element is arranged at opposite side to said pressure roller.

18. A fixing element for fixing an image onto a recording medium and having a pressure roller arranged in press contact with said recording medium and a heater device, wherein said heater as claimed in claim 2 is used for said heater device and said heater element is arranged at opposite side to said pressure roller.

19. An image forming apparatus comprising an image transferring device for adhering toner to an electrostatic latent image so as to form a toner image and transferring the toner image onto a recording medium, and a fixing device for fixing the toner image onto said recording medium, wherein, said fixing element as claimed in claim 17 is used for said fixing device.

20. An image forming apparatus comprising an image transferring device for adhering toner to an electrostatic latent image so as to form a toner image and transferring the toner image onto a recording medium, and a fixing device for fixing the toner image onto said recording medium, wherein, said fixing element as claimed in claim 18 is used for said fixing device.

* * * * *